United States Patent
Fukumasu et al.

(10) Patent No.: US 10,103,619 B2
(45) Date of Patent: Oct. 16, 2018

(54) ELECTRIC POWER CONVERSION DEVICE

(71) Applicant: HITACHI AUTOMOTIVE SYSTEMS, LTD., Hitachinaka-shi, Ibaraki (JP)

(72) Inventors: Keisuke Fukumasu, Tokyo (JP); Hiroki Funato, Tokyo (JP); Yuji Sobu, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 15/545,762

(22) PCT Filed: Dec. 25, 2015

(86) PCT No.: PCT/JP2015/086234
§ 371 (c)(1),
(2) Date: Jul. 24, 2017

(87) PCT Pub. No.: WO2016/136115
PCT Pub. Date: Sep. 1, 2016

(65) Prior Publication Data
US 2018/0019663 A1 Jan. 18, 2018

(30) Foreign Application Priority Data
Feb. 25, 2015 (JP) .................. 2015-035485

(51) Int. Cl.
*H05K 5/04* (2006.01)
*H02M 1/44* (2007.01)
(Continued)

(52) U.S. Cl.
CPC ............. *H02M 1/44* (2013.01); *H02M 3/337* (2013.01); *H02M 3/33576* (2013.01);
(Continued)

(58) Field of Classification Search
CPC .. H02M 1/44; H02M 3/33592; H05K 5/0217; H05K 5/04
See application file for complete search history.

(56) References Cited

U.S. PATENT DOCUMENTS

| 4,717,990 A * | 1/1988 | Tugcu ................. H05K 9/0037 174/384 |
| 4,903,169 A * | 2/1990 | Kitagawa ............... H05K 9/006 228/215 |

(Continued)

FOREIGN PATENT DOCUMENTS

| JP | 60-045479 U | 3/1985 |
| JP | 11-299260 A | 10/1999 |

(Continued)

OTHER PUBLICATIONS

International Search Report PCT/JP2015/086234, Apr. 5, 2016, 2 pgs.

*Primary Examiner* — Hoa C Nguyen
*Assistant Examiner* — Christopher L Augustin
(74) *Attorney, Agent, or Firm* — Volpe and Koenig, P.C.

(57) ABSTRACT

An electric power conversion device includes: an active circuit section emitting noises; an output-side filter circuit section; a chassis including a first space and a second space for housing the active circuit section and the filter circuit section respectively; and a base plate that is installed so as to cover at least the first space and is electrically connected to the chassis. Here, the chassis includes a first partition wall for partitioning the first space and the second space, the base plate is disposed so as to cover the first space, and includes a second partition wall along the first partition wall, and the second partition wall is disposed between the filter circuit section and the first partition wall in the first space.

8 Claims, 19 Drawing Sheets

(51) Int. Cl.
*H02M 3/335* (2006.01)
*H05K 5/02* (2006.01)
*H02M 3/337* (2006.01)

(52) U.S. Cl.
CPC ...... *H02M 3/33592* (2013.01); *H05K 5/0217* (2013.01); *H05K 5/04* (2013.01)

(56) References Cited

U.S. PATENT DOCUMENTS

| | | | |
|---|---|---|---|
| 6,583,682 B1* | 6/2003 | Dubhashi | H02M 1/12 333/12 |
| 9,318,958 B2* | 4/2016 | Sagneri | H02M 3/335 |
| 9,755,544 B2* | 9/2017 | Shin | H02M 7/48 |
| 2003/0081433 A1* | 5/2003 | Itakura | H02M 1/36 363/21.06 |
| 2003/0132041 A1* | 7/2003 | Beihoff | B60L 11/12 180/65.1 |
| 2013/0100634 A1 | 4/2013 | Okubo et al. | |
| 2014/0240946 A1 | 8/2014 | Fukumasu et al. | |
| 2015/0214857 A1* | 7/2015 | Kosuga | H02M 7/003 318/400.26 |

FOREIGN PATENT DOCUMENTS

| | | |
|---|---|---|
| JP | 2013-090533 A | 5/2013 |
| JP | 2013-099057 A | 5/2013 |

* cited by examiner

FIG.3
(a)
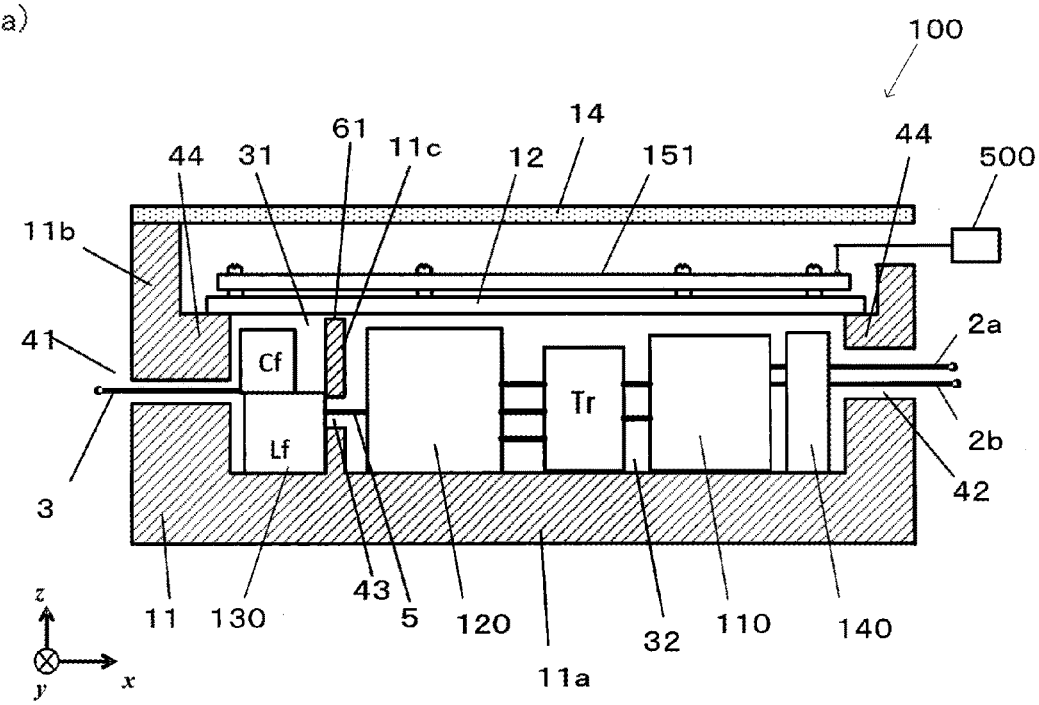
(b)
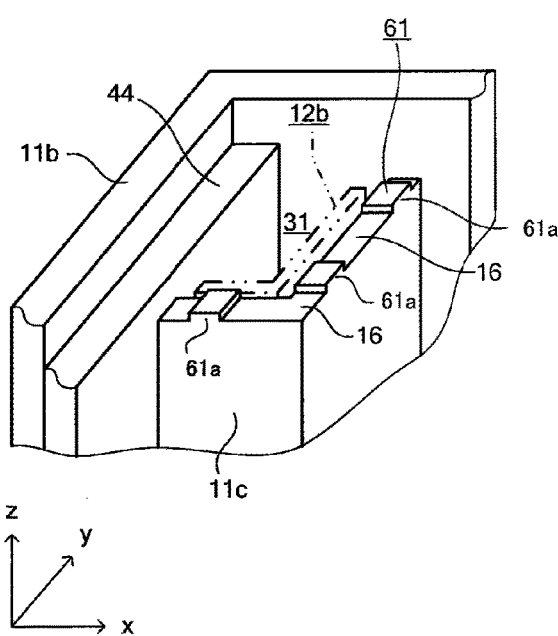

FIG.4
(a) xy PLANE
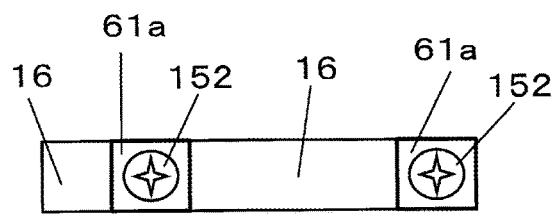
(b) zy PLANE
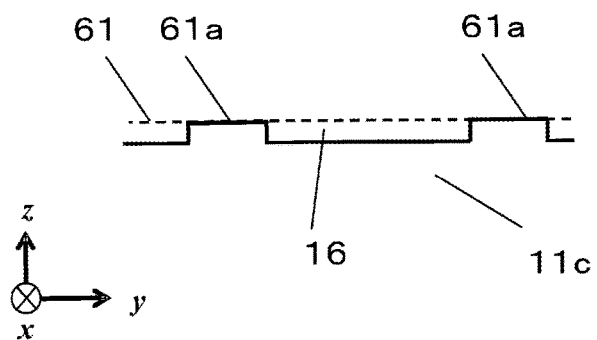

FIG.5
FIRST EMBODIMENT
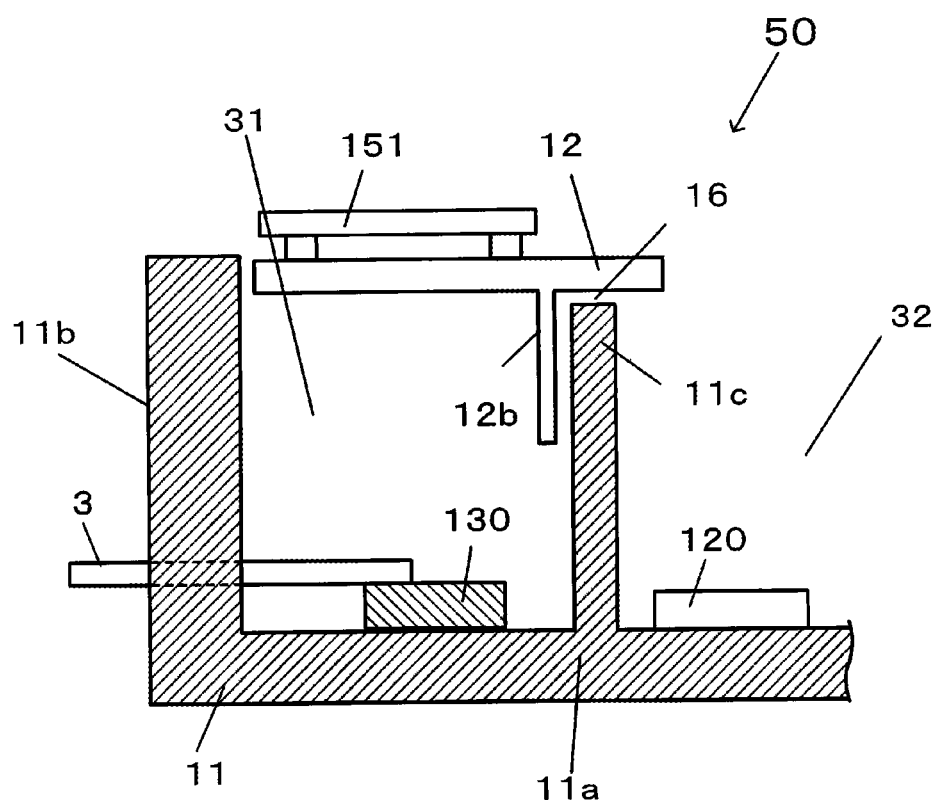
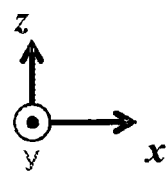

SECOND EMBODIMENT

THIRD EMBODIMENT

FORTH EMBODIMENT

FIFTH EMBODIMENT

FIG.15
SIXTH EMBODIMENT
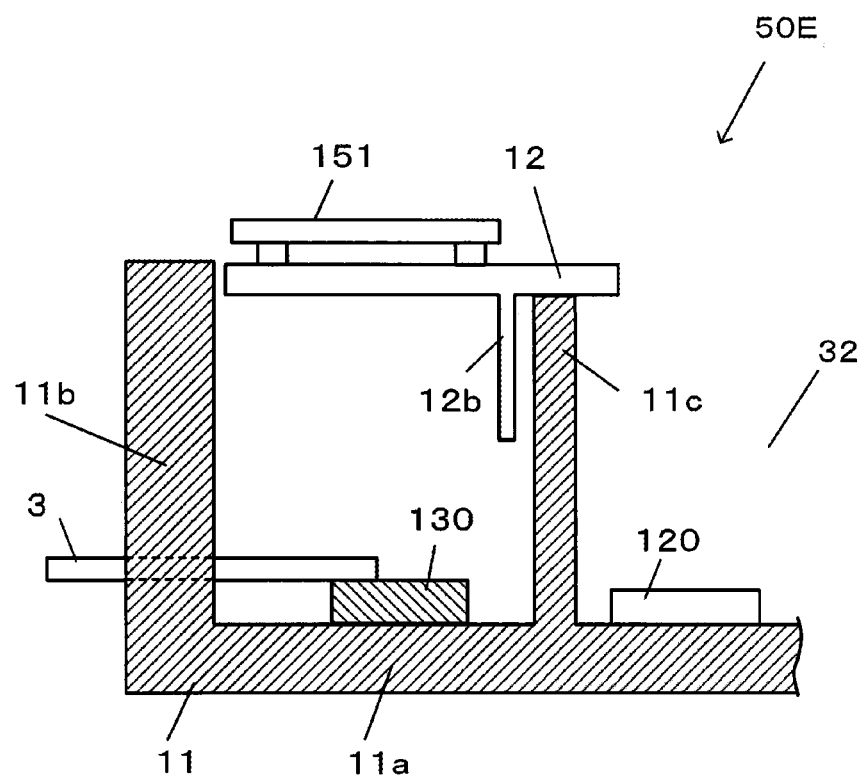
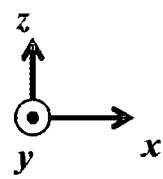

FIG.16
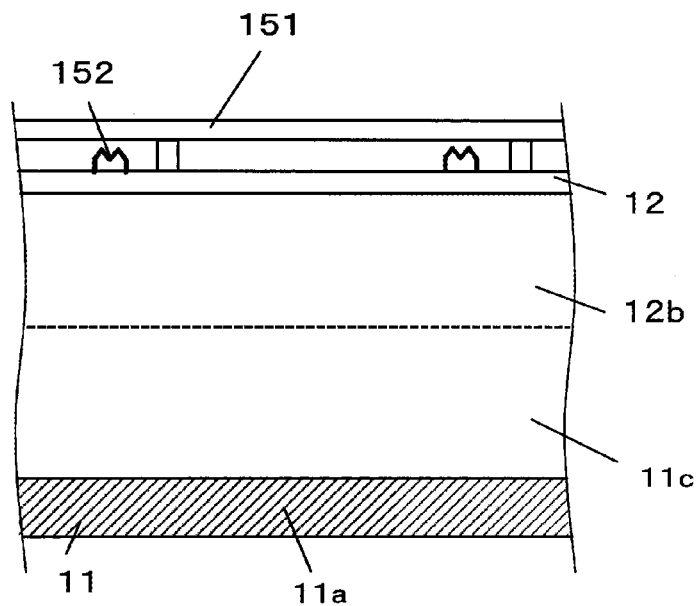
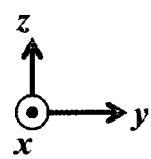

SEVENTH EMBODIMENT

FIG.18

COMPARISON DIAGRAM OF ELECTROMAGNETIC
NOISE REDUCTION EFFECTS

| MEASUREMENT STANDARD CONFIGURATION | CHASSIS / BASE PLATE / FILTER / INV | ELECTROMAGNETIC NOISE REDUCTION RATE RELATIVE TO MEASUREMENT STANDARD CONFIGURATION |
|---|---|---|
| COMPARISON EXAMPLE | CHASSIS / BASE PLATE / FILTER / INV | −0.7dB |
| FIRST EXAMPLE | CHASSIS / BASE PLATE / FILTER / INV | −1.8dB |
| SECOND EXAMPLE | CHASSIS / BASE PLATE / FILTER / INV | −2dB |
| THIRD EXAMPLE | CHASSIS / BASE PLATE / FILTER / INV | −3.5dB |
| FOURTH EXAMPLE | CHASSIS / BASE PLATE / FILTER / INV | −6.2dB |

FIG.19
(a)
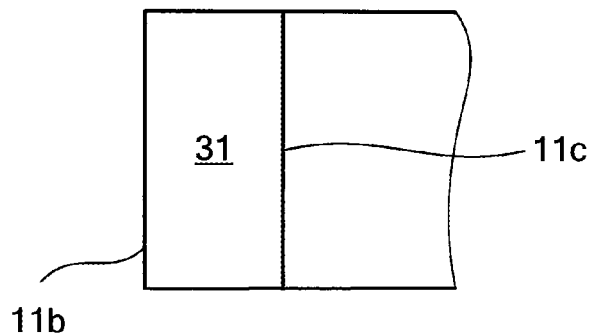
(b)
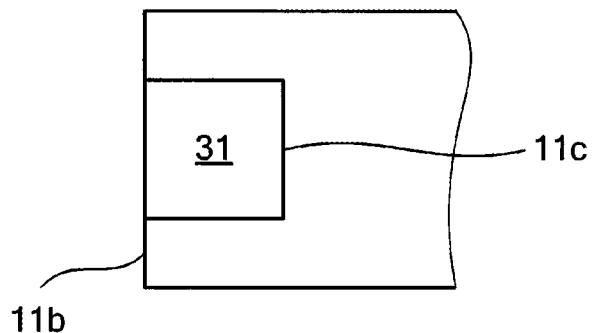
(c)
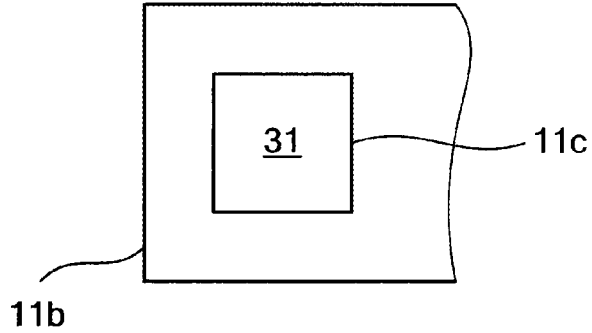

ELECTRIC POWER CONVERSION DEVICE

TECHNICAL FIELD

The present invention relates, for example, to a power conversion device such as a DC-DC converter or an inverter.

BACKGROUND ART

A high voltage battery for power driving, an inverter device for driving a motor by converting the DC high voltage output of the high voltage battery into an AC high voltage output, and a DC-DC converter device for supplying electric power to low voltage loads such as lamps and a radio of a vehicle by converting the DC high voltage output of the high voltage battery into a DC low voltage output, and the like are mounted on the vehicle such as a hybrid vehicle, a plug-in hybrid vehicle, or an electric vehicle.

A DC-DC converter device includes: a high voltage switching circuit for converting a DC high voltage into an AC high voltage; a transformer for converting the AC high voltage into an AC low voltage; a low voltage switching circuit for converting the AC low voltage into a DC low voltage; a filter circuit for reducing the propagation of noises generated from the DC-DC converter device to the outside; and a control circuit for generating control signals for controlling the switching circuits. A DC-DC converter device has a problem in that there is a possibility that electromagnetic noises leaking from switching circuits and a transformer propagate to a filter circuit and a control circuit with the result that electromagnetic couplings are induced.

The following structure is known as a structure capable of suppressing the propagations of electromagnetic noises.

The structure is described as configured in such a way that a shield wall is installed on a metal chassis for shielding an output filter from a voltage-boost/high-voltage circuit section including switching elements, and a metal base plate is fastened to the upper surface of the shield wall, and owing to this structure, radiation noises emitted from the switching elements are absorbed by the shield wall, so that electromagnetic noises that are superimposed on the output filter can be reduced. In addition, in this structure, a first shield wall that shields an output filter from switching elements is installed, and a second shield wall that separates the output filter from an output terminal and a bus bar is installed on the base plate as well. The second shield wall is disposed between the output filter and the output terminal, and the output filter is disposed between the first shield wall and the second shield wall (for example, refer to FIG. 9 in Patent Literature 1).

CITATION LIST

Patent Literature

Patent Literature 1: Japanese Unexamined Patent Application Publication No. 2013-99057

SUMMARY OF INVENTION

Technical Problem

A structure including a metal chassis in which only a shield wall, to which a metal base plate is fastened, is installed cannot efficiently prevent electromagnetic noises from being propagated to an output filter through an interspace between the shield wall and the base plate. Furthermore, even if a second shield wall for separating the output filter from an output terminal and a bus bar is installed, because the output filter is disposed between the first shield wall and the second shield wall, it is not possible to prevent electromagnetic noises from being propagated through an interspace between the first shield wall and the base plate to the output filter.

Solution to Problem

According to an embodiment of the present invention, an electric power conversion device includes: an active circuit section that emits noises; an output-side filter circuit section; a chassis including a first space and a second space for housing the active circuit section and the filter circuit section respectively; and a base plate that is installed so as to cover at least the first space and is electrically connected to the chassis. Here, the chassis includes a first partition wall for partitioning the first space and the second space, the base plate is disposed so as to cover the first space, and includes a second partition wall along the first partition wall, and the second partition wall is disposed between the filter circuit section and the first partition wall in the first space.

According to another embodiment of the present invention, an electric power conversion device includes: a DC-DC converter circuit; an output-side filter circuit section connected to the DC-DC converter circuit; an inverter circuit; a metal chassis for housing the DC-DC converter circuit, the filter circuit section, and the inverter circuit; and a metal base plate electrically connected to the metal chassis. Here, the chassis includes a first chassis-side partition wall for shielding the filter circuit section from the DC-DC converter and the inverter circuit, and a side wall disposed along the circumference of the filter circuit section, and the chassis is further partitioned by the first chassis-side partition wall and the side wall of the chassis, and includes a first space for housing the filter circuit section, and the base plate is disposed so as to cover the first space, formed along the inner surface of the side wall, and includes a first base plate-side partition wall extended to the filter circuit section side.

Advantageous Effects of Invention

According to the present invention, it is possible to reduce noises propagated from noise generating circuit section to a filter circuit section.

BRIEF DESCRIPTION OF DRAWINGS

FIG. 3($a$) is the schematic cross-section view of the electric power converter device shown in FIG. 2, and (b) is the perspective view of the periphery of a filter housing section.

FIGS. 4($a$) and ($b$) are enlarged views of parts of a first partition wall respectively. (a) is a plan view showing a part of the upper surface of the first partition wall, and (b) is a side view obtained when FIG. 4($a$) is viewed from the x direction.

FIG. 5 is a cross-section view viewed along arrows V-V in FIG. 2.

FIG. 5 is viewed from the x direction.

FIG. 7 is viewed from the x direction.

FIG. 9 is viewed from the x direction.

FIG. 11 is viewed from the x direction.

FIG. 13 is viewed from the x direction.

FIG. 15 is a cross-section view showing a sixth embodiment of the electromagnetic noise propagation reduction structure of the present invention.

FIG. 16 is a side view obtained when FIG. 15 is viewed from the x direction.

FIG. 18 is a comparison diagram showing the electromagnetic noise reduction effects of respective examples.

FIG. 19 is a modification example of the first partition wall.

DESCRIPTION OF EMBODIMENTS

First Embodiment

Figure 1:
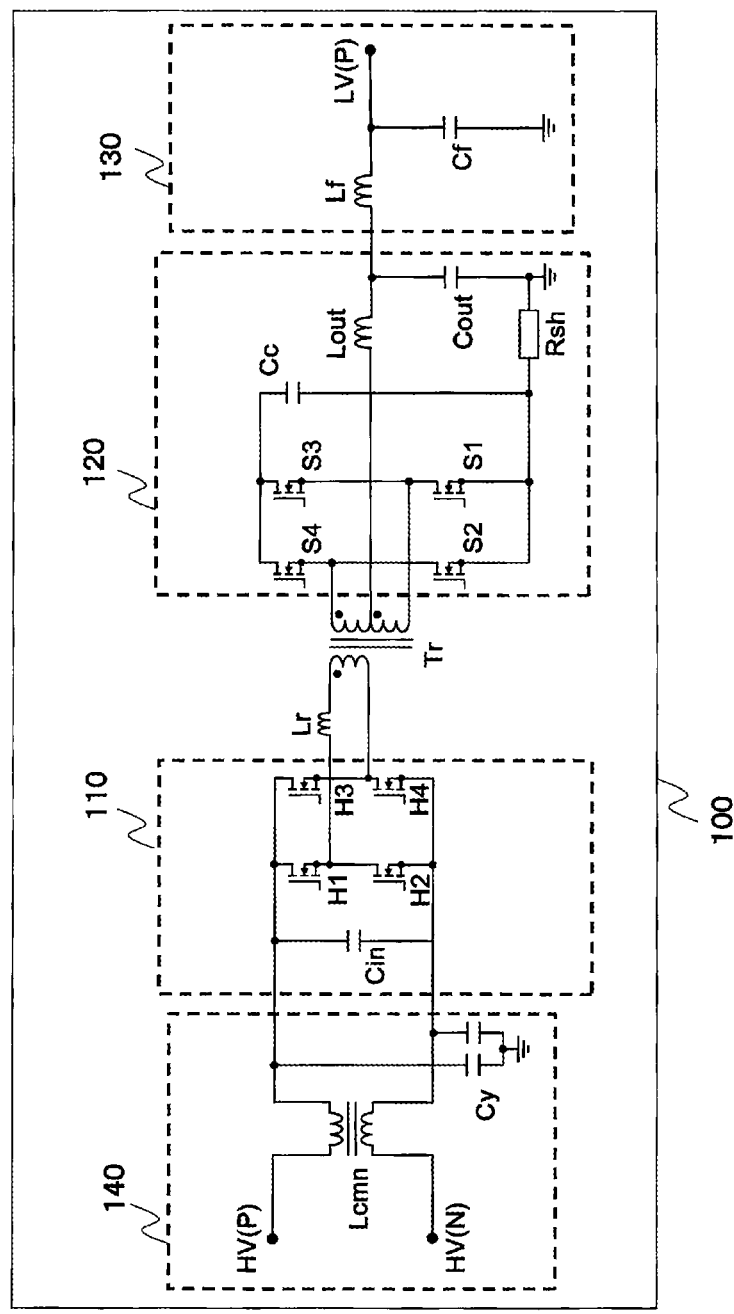
FIG. 1 is a diagram showing a main circuit of a DC-DC converter device as an embodiment of an electric power converter device of the present invention.

A DC-DC converter mounted on an automobile that obtains driving force from an electric motor (an automobile having only an electric motor as its driving force source or an automobile having an electric motor as its auxiliary driving force source) is typically comprised of a high voltage switching circuit, a transformer, a low voltage-side rectifying circuit, and a control circuit as its minimum fundamental configuration. Generally speaking, a DC-DC converter has functions to receive a high DC voltage power supply of several hundred volts for driving an electric motor, to convert the high DC voltage into an AC high voltage through a switching operation at a high voltage switching circuit using a switching signal supplied from a control circuit, to convert the AC high voltage into an AC low voltage by means of a transformer, and then to supply a low DC voltage supply of over ten volts to vehicle accessories.

The control circuit is a circuit that calculates and controls a switching operation at the time of DC-AC conversion, that is, calculates and controls an optimal switching period in accordance with the electric-power conditions of the above two power supplies or in accordance with a communication directive issued from the outside. In an electric power conversion instrument mounted on an automobile, it is required that the circuits of a high voltage system and the circuits of a low voltage system should be electrically isolated from each other for safety reasons. If a chassis is made of a conductive metal, the electric potential of the chassis and the electric potential of the body of the automobile are made the same electric potential in most cases, and the same electric potential is set as the reference electric potential of the low voltage system (set as a so-called chassis ground, which is equal to a ground electric potential). However, because the downsizing and integration of the circuits of the high voltage system and the circuits of the low voltage system are strongly required owing to the condition that those circuits are mounted on the automobile, in most cases the circuits of the high voltage system and the circuits of the low voltage system are housed in a lump in the chassis whose potential is the same as that of the body of the automobile to form an integrated unit, with the result that the above electric power conversion functions are realized. Here, as the typical electric power conversion characteristics of the DC-DC converter, the voltages of the circuits of the high voltage system are high but the currents of the circuits of the high voltage system are comparatively small (about 30 A), and the voltages of the circuits of the low voltage system are comparatively low but the currents the circuits of the low voltage system are large (about 200 A).

In the case where the circuits of those high voltage system and low voltage system are housed in one chassis, owing to the abovementioned electric power conversion characteristics of the high and low voltage systems, a relative positional relation between the high and low voltage systems, a distance between the disposition locations of the high and low voltage systems, and the disposition situations of the chassis and frame, there may arise a phenomenon in which voltage-dependent noises of the circuits of the high voltage system and current-dependent noises of the circuits of the low voltage system are electromagnetically coupled with other circuit systems. As a result, there occurs a problem that the electric power conversion, which is the fundamental function of the DC-DC converter, or failure of satisfying noise regulation values (specified by the regulations of various countries and by the requested specifications of customers).

In order to solve such a problem, it becomes necessary not only to reexamine the existing circuits, but also to add a shield case and conduction-enhancing parts as new noise control components, with the result that the price, volume, and weight of the DC-DC converter are increased as a product.

A first embodiment of the present invention will be explained with reference to FIG. 1 to FIG. 6 hereinafter.

In addition, components that are the same and used in common in more than one figures are given the same reference numerals, and redundant descriptions regarding the components will be omitted.

(Circuit Configuration of DC-DC Converter)

A DC-DC converter 100 will be explained below. Although this DC-DC converter 100 is a converter that converts the electric power of a high voltage battery to the electric power of a low voltage battery, the conversion is executed not only unidirectionally but also executed bi-directionally. In other words, not only the conversion from a high DC voltage power supply to a low DC voltage power supply, but also the conversion from a low DC voltage power supply to a high DC voltage power supply is executed by the DC-DC converter 100. FIG. 1 is a diagram showing an embodiment of the circuit configuration of the DC-DC converter 100.

As shown in FIG. 1, the DC-DC converter 100 shown as an embodiment of the present invention includes: a high voltage switching circuit section 110; a low voltage switching circuit section 120; an output-side filter circuit section 130; a transformer Tr disposed between the high voltage switching circuit section 110 and the low voltage switching circuit section 120; and an input-side filter circuit section 140. Switching controls of the high voltage switching circuit section 110 and the low voltage switching circuit section 120 are executed by a control circuit section installed on a control circuit board 151 (Refer to FIG. 3 and FIG. 5). Here, the control circuit section formed on the control circuit board 151 is not shown in FIG. 1.

The high voltage switching circuit section 110 includes switching elements H1 to H4 that are formed by MOSFETs and the like that are connected as an H bridge-type switching circuit, a resonant coil Lr, and a smoothing capacitor Cin. The smoothing capacitor Cin is disposed on the input side of the H bridge-type switching circuit, and smooths an input current input into the high voltage switching circuit section 110. Here, gate resistors (not shown in FIG. 1) are connected to the gate terminals of the switching elements H1 to H4.

The high voltage switching circuit section 110 surrounded with a dashed line in FIG. 1 is installed on a print circuit board that is used for connecting the switching elements H1 to H4, which are included in the high voltage switching circuit section 110, in an H bridge connection. Furthermore, other electronic parts other than a power semiconductor module comprised of the switching elements H1 to H4, the smoothing capacitor Cin, and the resonant coil Lr are installed on this print circuit board, and at the same time wiring patterns used for the other electronic parts are also formed on this print circuit board.

The low voltage switching circuit section 120 includes four switching elements S1, S2, S3, and S4 each of which is comprised of a MOSFET and the like, a coil Lout, and capacitors Cc and Cout. The low voltage switching circuit section 120 performs rectification by a synchronous rectification method, and realizes surge absorption by an active clamp method, which enables the usage of circuit parts with low withstand voltages and the downsizing of the DC-DC converter device. Here, the configuration of the low voltage rectifying circuit section is not necessarily the same as the configuration realized by the above-described synchronous rectification method, and may be a configuration using a diode rectification method, and further it is not indispensable to adopt the active clamp method.

Here, gate resistors, not shown, are connected to the gate terminals of the MOSFETs S1 to S4 respectively.

The output-side filter circuit section 130 includes an inductor Lf and a filter capacitor Cf.

Here, the circuit configuration of an output-side noise filter circuit is not limited to the circuit configuration shown in FIG. 1. Of course it is conceivable that the output-side noise filter circuit is realized by plural elements.

Wrings for connecting the switching elements S1 to S4 of the low voltage switching circuit section 120 surrounded with a dashed line in FIG. 1 are formed on a circuit board. In addition, electronic parts shown in FIG. 1 other than the coil Lout are implemented on this circuit board, and wiring patterns for connecting them are also provided on this circuit board.

The control circuit section (not shown) formed on the control circuit board 151 generates switching signals to be supplied to the high voltage switching circuit section 110 and the low voltage switching circuit section 120, and controls the operation of the entirety of the DC-DC converter 100.

The input-side filter circuit section 140 includes common mode filters Lcmn and capacitors Cy between a high voltage power supply and the smoothing capacitor Cin. The common mode filters and the capacitors prevent common mode noises from being propagated to the high voltage power supply and battery cables. Although the filter circuit section 130 is fundamentally comprised of a coil and a capacitor, it is conceivable that the filter circuit section 130 is comprised of only a capacitor. Here, the circuit in FIG. 1 does not show the number of elements, but shows examples of circuit symbols. It is a matter of course that the circuit shown in FIG. 1 can be realized using plural elements. Furthermore, the input-side filter circuit section 140 is not always required, and whether the input-side filter circuit section 140 should be adopted or not can be decided with reference to the specification of the DC-DC converter 100.

Next, the entire configuration of the DC-DC converter 100 will be explained.

(Entire Configuration of DC-DC Converter)

Figure 2:
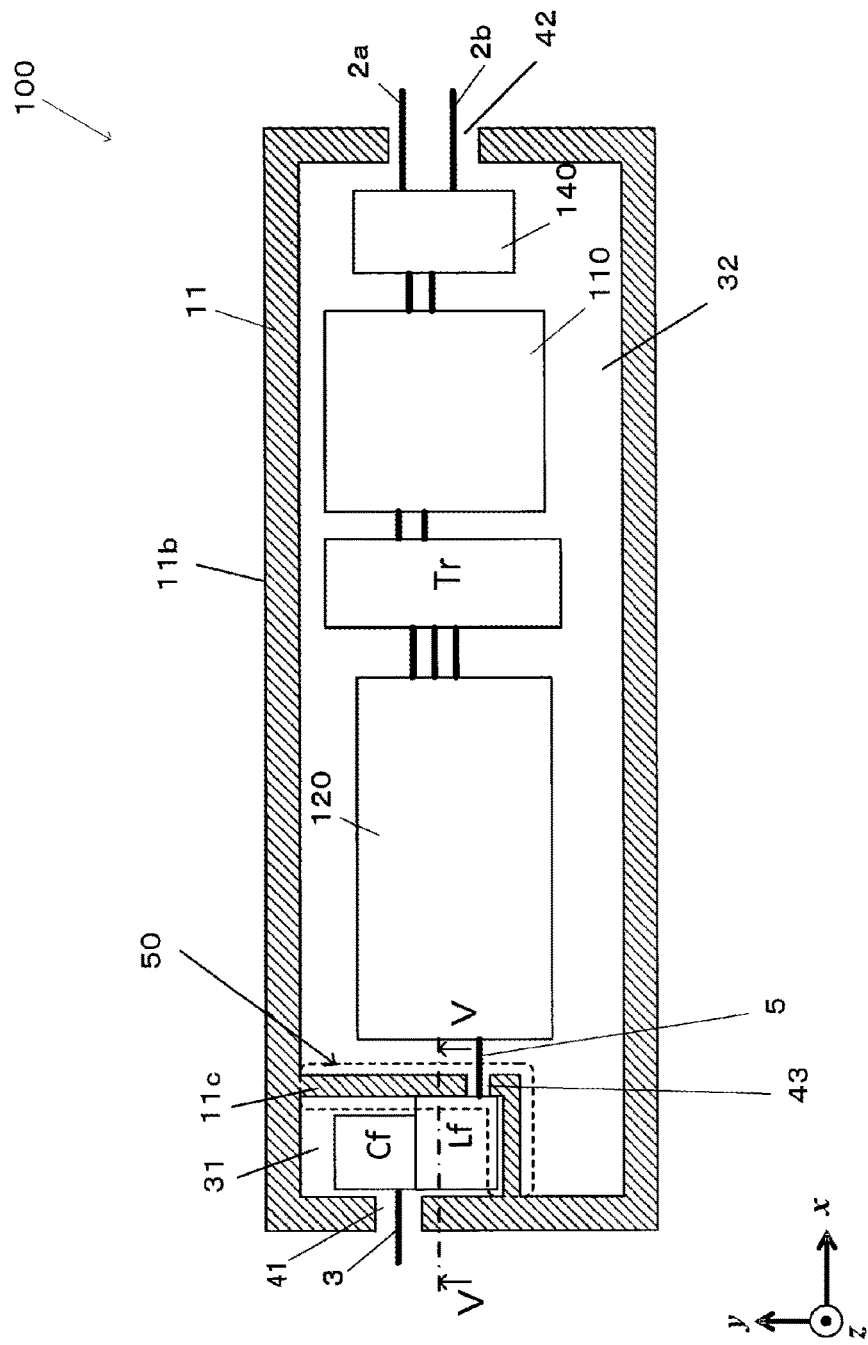
FIG. 2 is a diagram showing the schematic plan view of a first embodiment of an electric power converter device of the present invention.

FIG. 2 is the schematic plan view of the first embodiment of the electric power conversion device of the present invention, FIG. 3(a) is the schematic cross-section view of the electric power conversion device shown in FIG. 2, and FIG. 3(b) is the perspective view of the periphery of a filter housing section.

In the following figures, the x direction, the y direction, and the z direction used in each figure are shown in each figure.

The first embodiment of the present invention will be explained by taking the DC-DC converter 100 as an example of a power conversion device.

The DC-DC converter 100, which is an electric power conversion device, includes a chassis 11 and a case lid 14 fixed to the chassis 11 with a fixing means (not shown) such as a fastening member. The circuit parts of the DC-DC converter 100 shown in FIG. 1 are housed in the chassis 11. The chassis 11 and the case lid 14 are formed of an aluminum die-cast metal, for example. The chassis 11 is electrically connected to the body or chassis of an automobile on which the DC-DC converter is mounted, so that a ground electric potential becomes equal to that of the body of the automobile.

The top plan view of the chassis 11 shows the shape of an almost rectangular as shown in FIG. 2. In addition, the chassis 11 includes a bottom portion 11a and a peripheral side wall 11b that is almost perpendicular to the bottom portion 11a as shown in FIG. 3(a), and the chassis 11 is formed in a box shaped structure. In the chassis 11, a first partition wall 11c, which is extended almost perpendicularly to the bottom portion 11a, is formed. The first side wall 11c is integrally molded with the chassis 11. As shown in FIG. 3(b), the first partition wall 11c is formed in an almost L shape at one of the corner portions of the peripheral side wall 11b, so that a filter housing section 31 is formed with the first partition wall 11c and the one of the corner portions of the peripheral side wall 11b. The inductor Lf and the capacitor Cf, which are included in the filter circuit section 130, are housed in the filter housing section 31. In addition, an output terminal, which is connected to the filter circuit section 130 and not shown, is also housed in the filter housing section 31. An output bus bar 3 is connected to this output terminal, and the output bus bar 3 is extended through an opening 41 formed in the peripheral side wall 11b to the outside.

A space in the chassis 11 except a space occupied by the filter housing section 31 is a conversion circuit section housing section 32. The conversion circuit section housing section 32 houses the high voltage switching circuit section 110, the low voltage switching circuit section 120, the transformer Tr, and the input-side filter section 140. An input terminal (not shown) is installed in the filter circuit section 140, input DC bus bars 2a and 2b are connected to this input terminal, and these DC bus bars 2a and 2b are extended to the outside through an opening 42 formed in the peripheral side wall 11b.

Furthermore, shield members (not shown) are inserted between the bus bar 3 and the opening 41, and between the bus bars 2a, 2b and the opening 42 respectively to block off electromagnetic noises from the outside.

As shown in FIGS. 3(a) and (b), a step section 44 is formed on the inner surface of the peripheral side wall lib of the chassis 11. The step section 44 is formed in a position higher than any part disposed in the chassis 11, and a base plate 12 is mounted on this step section 44. The control circuit board 151 is disposed on the base plate. The control circuit board 151 is fixed to the base plate 12 with fastening members and the like. The case lid 14 is disposed over the control circuit board 151.

The switching elements H1 to H4, not shown, are thermally connected to the bottom portion 11a of the chassis 11. The bottom portion 11a of the chassis 11 is thermally connected to a cooling flow channel member, not shown, including a cooling flow channel for a cooling medium such as cooling water, and the switching elements H1 to H4 are cooled by the cooling flow channel member via the chassis 11. Cooling mechanisms similar to this cooling mechanism are used for other heat generating components such as the switching elements S1, S2, S3, and S4, the transformer Tr that form the low voltage switching circuit section 120, and other heat-generating members.

The filter circuit section 130 is electrically connected to the low voltage switching circuit section 120 via a connection bus bar 5 that passes through an opening 43 formed in the first separation wall 11c. As shown in FIG. 2 and FIG. 3(a), one end of the inductor Lf, which is a ferrite core, in the filter housing section 31 is disposed in the state of being closely-attached to the first partition wall 11c to block off the opening 43. Therefore, electromagnetic noises are not propagated to the inside of the filter housing section 31 via the opening 43. Here, as shown in FIG. 3(a), a light electric power supply 500 is connected to the control circuit board 151.

(Electromagnetic Noise Propagation Reduction Structure)

An electromagnetic noise propagation reduction structure 50 is installed in an area surrounded by a dotted line in FIG. 2.

FIGS. 4(a) and (b) are enlarged views of parts of the first partition wall shown in FIG. 2 respectively. FIG. 4(a) is a plan view showing a part of the upper surface of the first partition wall 11c, and FIG. 4(b) is a side view obtained when FIG. 4(a) is viewed from the x direction. FIG. 5 is a cross-section view viewed along arrows V-V in FIG. 2, and FIG. 6 is a side view obtained when FIG. 5 is viewed from the x direction.

As shown in FIG. 3(b), FIGS. 4(a) and (b), concave portions 16 are formed on the upper surface 61 of the first partition wall 11c. In other words, plural mounting portions 61a are provided in the upper direction (the z direction) from the concave portions 16 respectively on the upper surface 61 in such a way that the plural mounting portions 61a are separated from each other by the concave portions 16.

Figure 6:
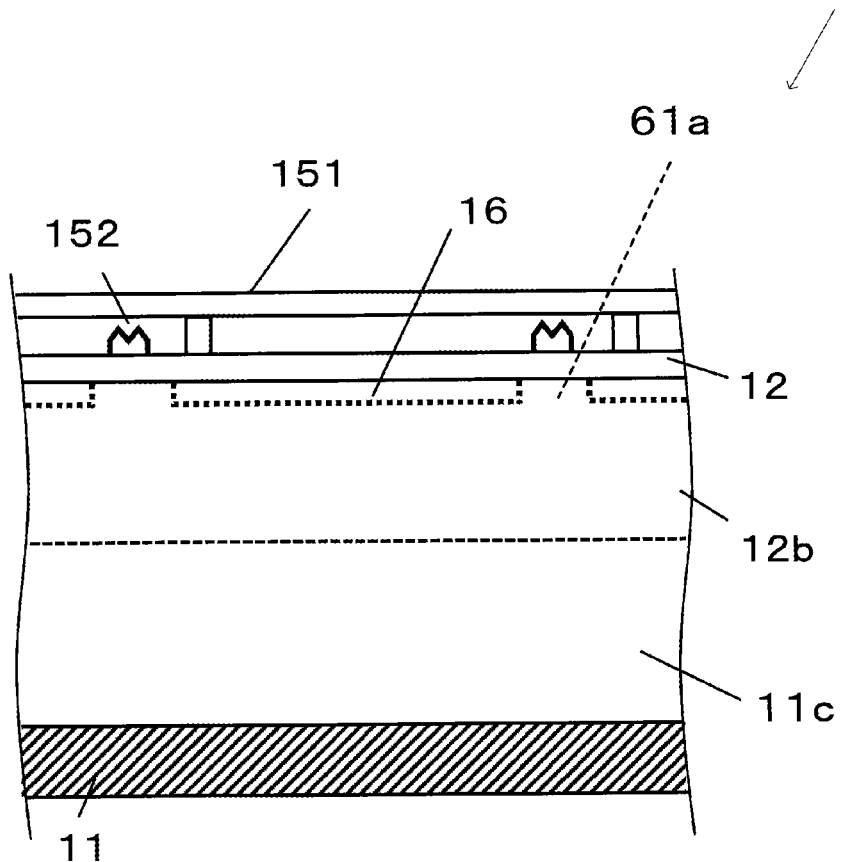
FIG. 6 is a side view obtained when

The base plate 12 is fastened and fixed to these mounting portions 61a with fastening members 152 such as screws (refer to FIG. 4 and FIG. 6). The base plate 12 and the first partition wall 11c are electrically connected to each other because they are fastened with the fastening member 152. The upper part of the filter housing section 31 is covered with the base plate 12. As shown in FIG. 5, the control circuit board 151 including the control circuit section is fixed with fastening members in an area that is above the upper surface of the base plate 12 and symmetrical to the filter housing section 31. One of the fastening members connects the ground pattern of the control circuit section (not shown) to the base plate 12.

In the fastening structure between the base plate 12 and the first partition wall 11c, the concave portions 16 of the first partition wall 11c forms interspaces between the first partition wall 11c and the base plate 12. Here, in FIG. 4(a), the base plate 12 is not shown in order to clearly show the relation between the fastening members 152 and the first partition wall 11c.

As shown in FIG. 5, a second partition wall 12b along the first partition wall 11c is integrally molded with the base plate 12. The second partition wall 12b is shown by a chain double-dashed line in FIG. 3(b). The second partition wall 12b is disposed between the first partition wall 11c and the filter circuit section 130 in the filter housing section 31, and the second partition wall 12b is formed along the entire length of the first partition wall 11c with a small interspace therebetween. The second partition wall 12b is extended from the bottom surface of the base plate 12 to the bottom portion 11a of the chassis 11 until the middle of the first partition wall 11c. The length of the second partition wall 12b in the z direction, that is, in the up-and-down direction is shorter than the length of the first partition wall 11c in the z direction. It is necessary that the length of the second partition wall 12b in the up-and-down direction should be larger than the depths of the concave portions 16 of the first partition wall 11c. The longer the length of the second partition wall 12b is, the better as long as the second partition wall 12b does not disturb the arrangement of the components of the filter circuit section 130.

As described above, the electromagnetic noise propagation reduction structure 50 shown in FIG. 2 is comprised of the first partition wall 11c and the second partition wall 12b.

Next, the operation performed by the electromagnetic noise propagation reduction structure 50 will be explained.

Electromagnetic noises emitted from the low voltage switching circuit section 120 are absorbed in the first partition wall 11c. However, parts of the electromagnetic noises come in the filter housing section 31 through the concave portions 16 formed in the first partition wall 11c. If the electromagnetic noises are propagated to the filter circuit section 130 and induces electromagnetic couplings, the capability of the filter may be deteriorated. The electromagnetic noises are attenuated in accordance with the width and length of interspaces that become the propagation path of the electromagnetic noises. In the case where the filter housing section 31 and the conversion circuit section housing section 32 are separated from each other by only the first partition wall 11c, the length of the interspaces, which becomes the propagation path of the electromagnetic noises, is only the thickness of the first partition wall 11c, that is, the length of the first partition wall 11c in the x direction or in the y direction. In the first embodiment of the present invention, the second partition wall 12b was formed lying adjacent to the first partition wall 11c. In this structure, the length of the interspaces, which becomes an electromagnetic noise propagation path, becomes virtually longer than in the case where the second partition wall 12b is not formed by the length of a portion where the first partition wall 11c and the second partition wall 12b overlap each other. Therefore, the electromagnetic noise reduction effect can be larger than in the case of only the first partition wall 11c being formed.

Here, as described above, it is preferable that the chassis 11 should be connected to the body of the automobile for grounding.

Alternatively, it is conceivable that the second partition wall 12b is disposed between the first partition wall 11c and the low voltage switching circuit section 120 in the conversion circuit section housing section 32. However, in a structure in which the second partition wall 12b is disposed nearer to the low voltage switching circuit section 120 than the first partition wall 11c is disposed (hereinafter, referred to as "a comparison structure"), electromagnetic noises emitted from the low voltage switching circuit section 120 are directly absorbed in the second partition wall 12b nearer than the first partition wall 11c, and the absorbed electromagnetic noises are propagated to the base plate 12.

If the electromagnetic noises are absorbed in the second partition wall 12b nearer than the first partition wall 11c, and then absorbed in the base plate 12, they are propagated to the control circuit section and the like installed on the control circuit board 151 via the base plate 12, therefore there is a higher possibility in this case that the electromagnetic noises are electromagnetically coupled with other circuits such as the control circuit section in this case than in the case where the electromagnetic noises are propagated to the chassis 11 and the ground via the first partition wall 11c. Therefore, in the comparison structure, it is not possible to make the length of the second partition wall 12b, which is disposed between the first partition wall 11c and the low voltage switching circuit section 120, in the up-and-down direction substantially large. In other words, the length of the interspaces, which becomes the propagation path of the electromagnetic noises, cannot be made substantially large.

On the other hand, in the first embodiment of the present invention, where the second partition wall 12b is disposed between the first partition wall 11c and the filter circuit section 130, there is no possibility that electromagnetic coupling with other circuits such as that observed in the comparison structure will occur. Therefore, it is possible to make the length of interspaces, which becomes the propagation path of the electromagnetic noises, substantially large, which leads to the large increase of the electromagnetic noise propagation reduction effect.

Next, the reason why the concave portions 16 are formed on the upper surface 61 of the first partition wall 11c will be explained.

The upper surface 161 of the first partition wall 11c is fastened to the base plate 12 in surface contact. Therefore, there is a possibility that, owing to vibrations and impacts from the outside, the base plate 12 and the upper surface 61 of the first partition wall 11 make contact with or scrape against each other and they are worn away so that metal powder is generated. There is a possibility that the generation of the metal powder owing to the abovementioned wear leads to the malfunctions of the above circuit sections such as a short circuit.

Forming the concave portions 16 on the upper surface 61 of the first partition wall 11c makes the areas of the mounting portions 61a of the first partition wall 11c small, so that the metal powder generated by the wear are prevented from occurring. For this reason, the concave portions 16 are formed on the upper surface 61 of the first partition wall 11c in advance.

However, if the DC-DC converter 100 is installed in an environment where the DC-DC converter 100 is rarely affected by vibrations and impacts, a structure in which the concave portions 16 are not formed on the upper surface 61 of the first partition wall 11c can be adopted in the abovementioned first embodiment.

As described above, the following effects are brought about by the DC-DC converter 100 of the first embodiment.

(1) The second partition wall 12b formed on the metal base plate 12 was electrically and mechanically fixed to the first partition wall 11c formed in the metal chassis 11 using the fastening members 152. The second partition wall 12b is formed along the entire length of the first partition wall 11c with a small interspace therebetween. Therefore, the length of the electromagnetic noise propagation path becomes larger, which can make the electromagnetic noise reduction effect larger.

(2) The second partition wall 12b is disposed between the low voltage switching circuit section 120 and the filter circuit section 130. Therefore, among the electromagnetic noises emitted from the low voltage switching circuit section 120, only electromagnetic noises that pass through the concave portions 16, which are interspaces between the first partition wall 11c and the base plate 12, are propagated to the second partition wall 12b. For this reason, the amount of electromagnetic noises that is absorbed in the base plate 12 in the abovementioned case is smaller than that in a structure in which the second partition wall is disposed nearer to the low voltage switching circuit section 120 than the first partition wall 11c is disposed. In other words, other circuits are hardly affected by the electromagnetic noises via the base plate 12 in this case. In such a way, by means of the second partition wall 12b and the first partition wall 11c, the length of the propagation path of electromagnetic noises is made large, which makes it possible to realize a large electromagnetic noise reduction effect.

Second Embodiment

Figure 7:
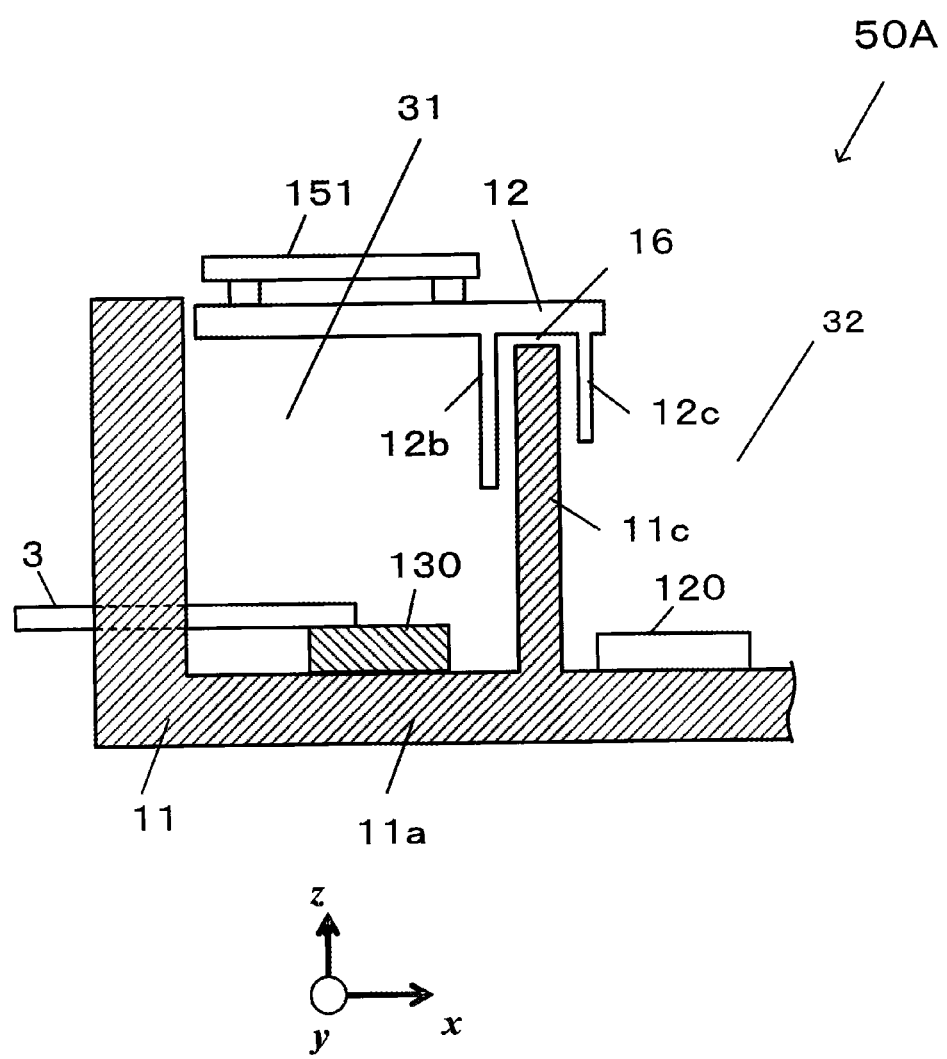
FIG. 7 is a schematic cross-section view showing a shield structure of a second embodiment of the present invention.
Figure 8:
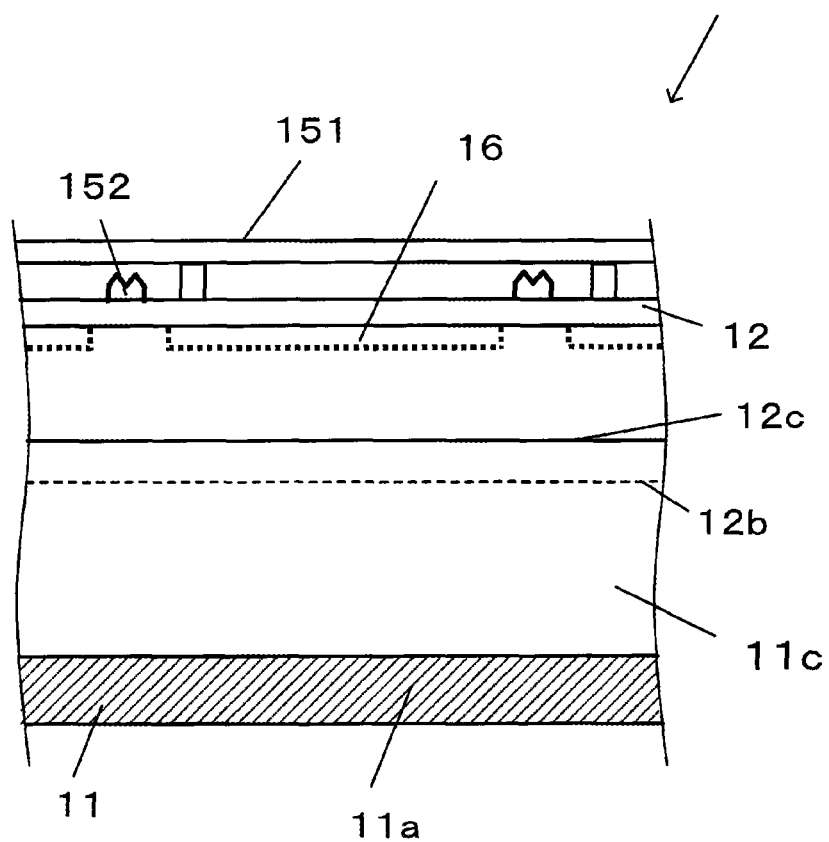
FIG. 8 is a side view obtained when

FIG. 7 is a cross-section view showing a second embodiment of the electromagnetic noise propagation reduction structure of the present invention, and FIG. 8 is a side view obtained when FIG. 7 is viewed from the x direction. FIG. 7 and FIG. 8 correspond to FIG. 5 and FIG. 6 of the first embodiment respectively.

The DC-DC converter 100 of the second embodiment includes an electromagnetic noise propagation reduction structure 50A. The electromagnetic noise propagation reduction structure 50A has a structure further including a third partition wall 12c in addition to the electromagnetic noise propagation reduction structure 50 of the first embodiment.

In other words, a base plate 12 of the second embodiment is integrally molded with a second partition wall 12b and the third partition wall 12c.

The second partition wall 12b is disposed between a first partition wall 11c and a filter circuit section 130 as is the case with the first embodiment. The third partition wall 12c is disposed between a first partition wall 11c and a low voltage switching circuit section 120. The third partition wall 12c is formed along the entire length of the first partition wall 11c with a small interspace therebetween. The third partition wall 12c is extended the bottom surface of the base plate 12 to the bottom portion 11a of a chassis 11 until the middle of the first partition wall 11c. The length of the third partition wall 12c in the up-and-down direction is shorter than the length of the second partition wall 12b in the up-and-down direction.

Other structures of the second embodiment are the same as those of the first embodiment, and members and portions corresponding to those of the first embodiment are given the same reference signs, and explanations about these members and portions will be omitted.

The electromagnetic noise propagation reduction structure 50A of the second embodiment includes the third partition wall 12c in addition to the first partition wall 11c, so that the electromagnetic noise propagation path in this case gets longer by just that much than in the case of the electromagnetic noise propagation reduction structure 50 of the first embodiment.

Therefore, the electromagnetic noise reduction effect in this case can be made larger.

Here, as described above, if the length of the third partition wall 12c in the up-and-down direction is made larger, the amount of electromagnetic noises absorbed in the base plate 12 increases, therefore this length cannot be made very large. For this reason, in an example shown in FIG. 7, the length of the third partition wall 12c in the up-and-down direction is made shorter than that of the second partition wall 12b. However, if influence exerted on other circuits is small, it is conceivable that the length of the third partition wall 12c in the up-and-down direction can be made almost equal to that of the second partition wall 12b. Furthermore, it is also conceivable that the length of the second partition wall 12b in the up-and-down direction can be made shorter than that of the third partition wall 12c for the convenience of the layout of the filter circuit section 130 housed in a filter housing section 31.

Third Embodiment

Figure 9:
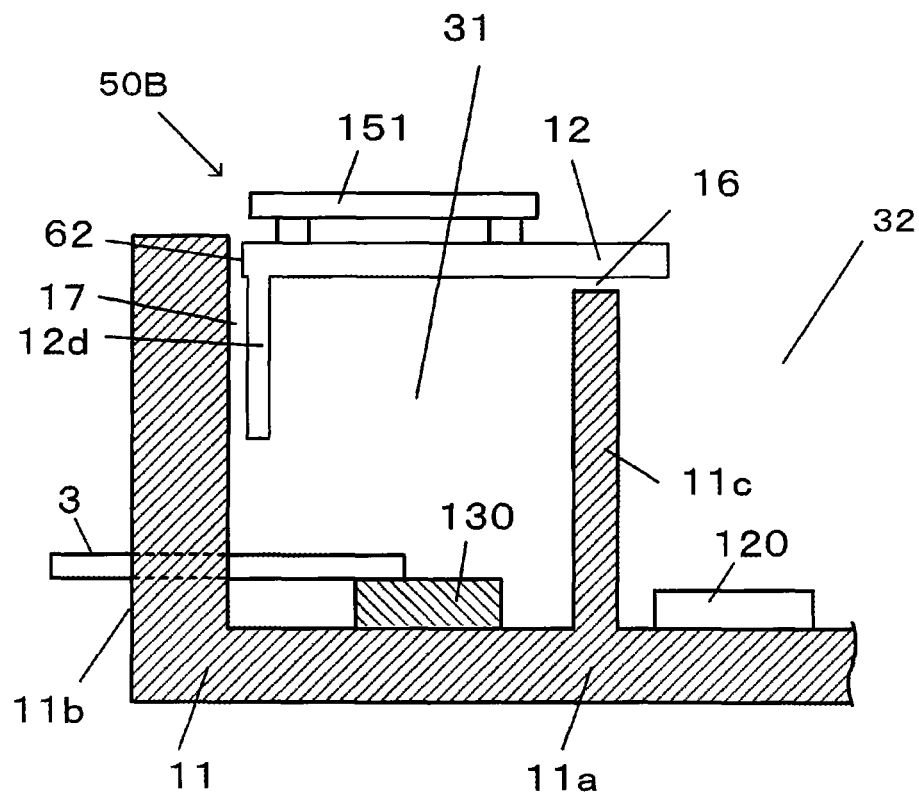
FIG. 9 is a cross-section view showing a third embodiment of the electromagnetic noise propagation reduction structure of the present invention.
Figure 10:
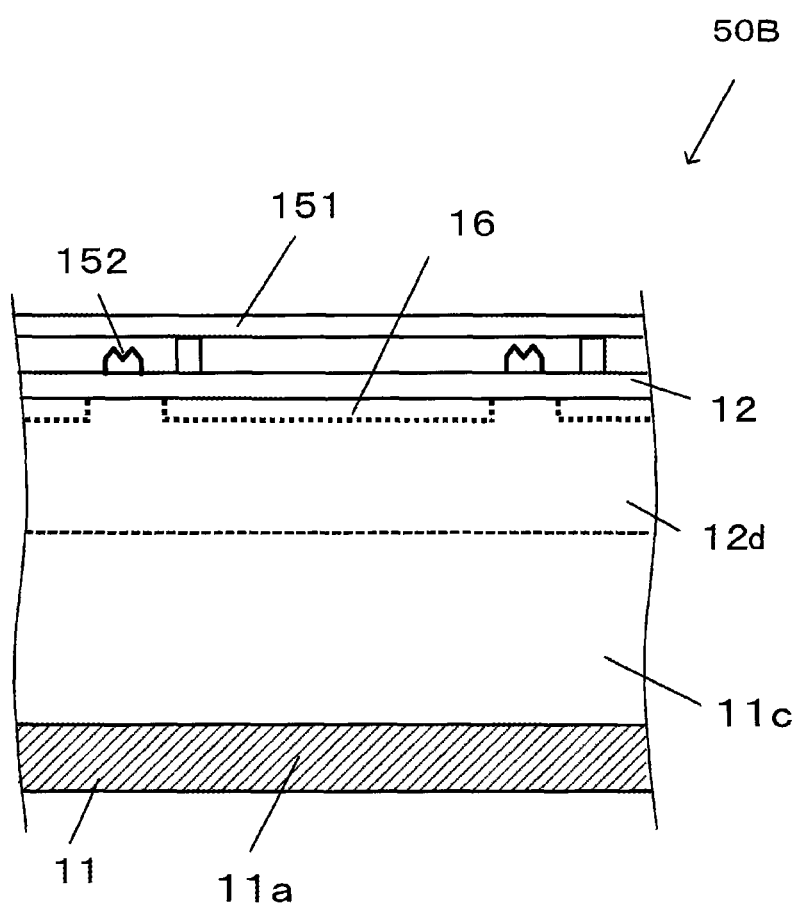
FIG. 10 is a side view obtained when

FIG. 9 is a cross-section view showing a third embodiment of the electromagnetic noise propagation reduction structure of the present invention, and FIG. 10 is a side view obtained when FIG. 9 is viewed from the x direction.

A DC-DC converter 100 according to the third embodiment includes an electromagnetic noise propagation reduction structure 50B. The electromagnetic noise propagation reduction structure 50B is formed in the vicinities of the inner surface of the peripheral side wall 11b of a chassis 11 and the side edge surface 62 of a base plate 12.

As shown in FIG. 2 and FIG. 3(b), a filter housing section 31 is fastened to one of four corner portions of the chassis 11 while one of the corner portions of a partition wall 11c is aligned with the one of four corner portions of the chassis 11. When the base plate 12 is fastened to the partition wall 11c, interspaces 17 are formed between the inner surface of the above peripheral side wall 11b of the chassis 11 and the above side edge surface 62 of the base plate 12 owing to tolerance and fixing dispersion.

A fourth partition wall 12d, which is extended from the bottom surface of a part of the base plate 12 where the part of the base plate faces the peripheral side wall 11b to the bottom portion 11a of the chassis 11, is integrally molded with the base plate 12. The fourth partition wall 12d is formed along the inner surface of the peripheral side wall 11b of the chassis 11 over the entire inside of the filter housing section 31 with a small interspace between the fourth partition wall 12d itself and the inner surface of the peripheral side wall 11b. The fourth partition wall 12d is extended to the bottom portion 11a of the chassis 11 until the middle of the height of the peripheral side wall 11b.

In other words, the electromagnetic noise propagation reduction structure 50B that makes the length of an electromagnetic noise propagation path longer is formed with the peripheral side wall 11b of the chassis 11 and the fourth partition wall 12d of the base plate 12. Electromagnetic noises that are propagated to a filter circuit section 130 via the interspaces 17 are suppressed by this electromagnetic noise propagation reduction structure 50B.

Other structures of the third embodiment are the same as those of the first embodiment, and members and portions corresponding to those of the first embodiment are given the same reference signs, and explanations about these members and portions will be omitted.

The DC-DC converter 100 of the third embodiment brings about the effect of reducing the electromagnetic noises propagated to the filter circuit section 130 as is the case with the first embodiment. The third embodiment is very effective for the case where electric noises that are propagated through an interspace between the peripheral side wall 11b of the chassis 11 and the side edge surface 62 of the base plate 12 are large.

Fourth Embodiment

Figure 11:
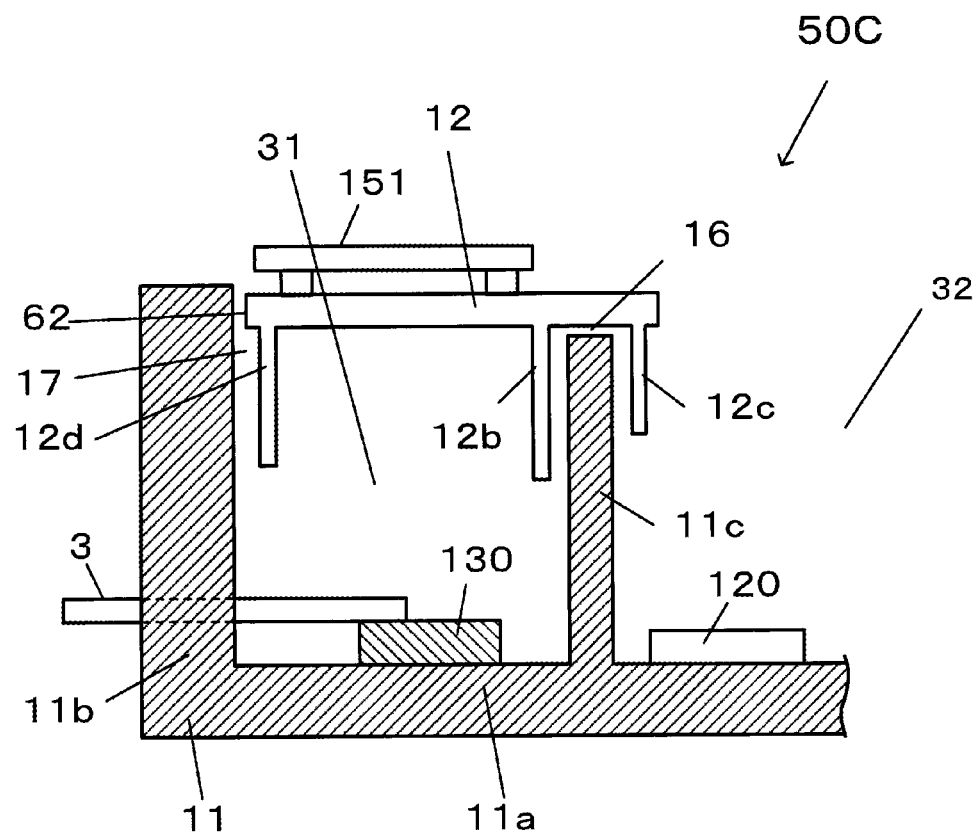
FIG. 11 is a cross-section view showing a fourth embodiment of the electromagnetic noise propagation reduction structure of the present invention.
Figure 12:
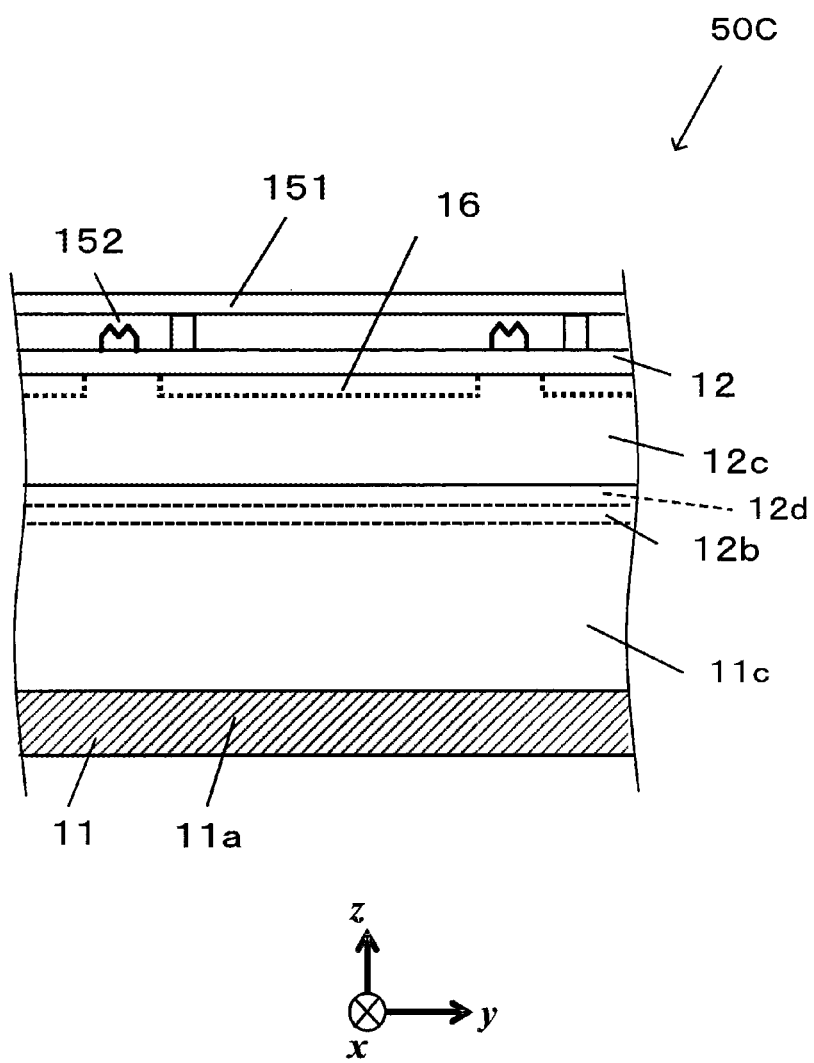
FIG. 12 is a side view obtained when

FIG. 11 is a cross-section view showing a fourth embodiment of the electromagnetic noise propagation reduction structure of the present invention, and FIG. 12 is a side view obtained when FIG. 11 is viewed from the x direction.

A DC-DC converter 100 according to the fourth embodiment includes an electromagnetic noise propagation reduction structure 50C. The electromagnetic noise propagation reduction structure 50C has a structure obtained by combining the electromagnetic noise propagation reduction structure 50A of the second embodiment and the electromagnetic noise propagation reduction structure 50B of the third embodiment.

In other words, a second partition wall 12b, a third partition wall 12c, and a fourth partition wall 12d are integrally molded with a base plate 12.

Other structures of the fourth embodiment are the same as those of the first embodiment, and members and portions corresponding to those of the first embodiment are given the same reference signs, and explanations about these members and portions will be omitted.

Because the fourth embodiment has both advantage effect of the second embodiment and that of the third embodiment, the fourth embodiment can provide an even larger electromagnetic noise reduction effect.

Fifth Embodiment

Figure 13:
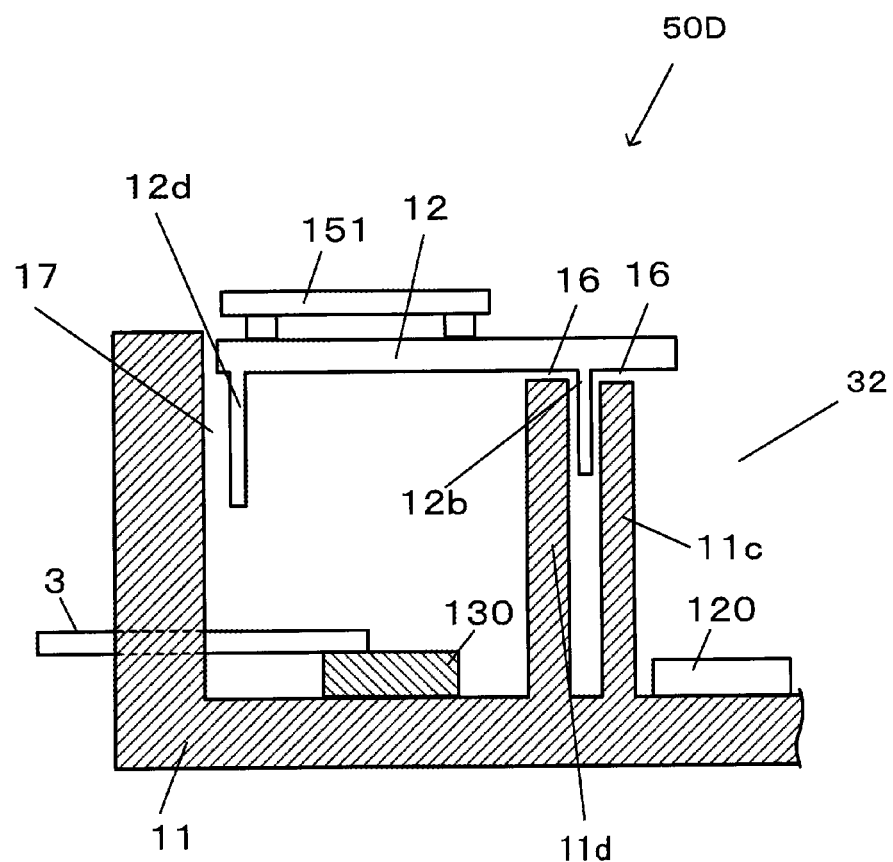
FIG. 13 is a cross-section view showing a fifth embodiment of the electromagnetic noise propagation reduction structure of the present invention.
Figure 14:
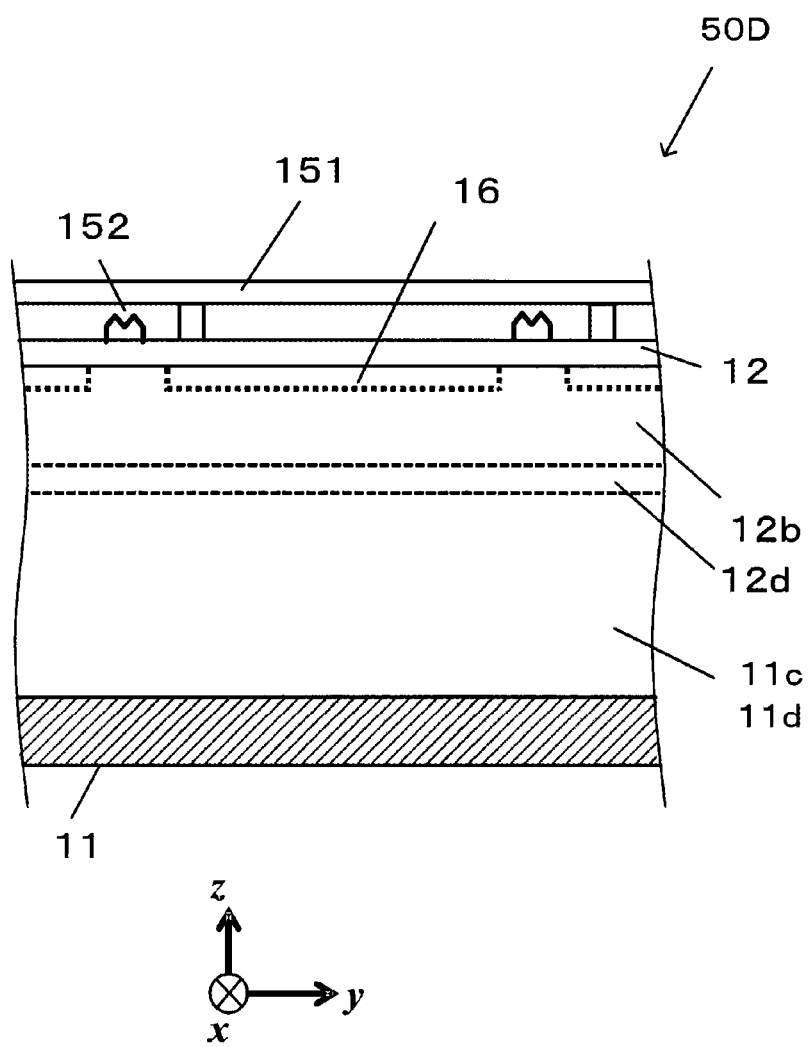
FIG. 14 is a side view obtained when

FIG. 13 is a cross-section view showing a fifth embodiment of the electromagnetic noise propagation reduction structure of the present invention. FIG. 14 is a side view obtained when FIG. 13 is viewed from the x direction.

A DC-DC converter 100 according to the fifth embodiment includes an electromagnetic noise propagation reduction structure 50D. The electromagnetic noise propagation reduction structure 50D includes a first partition wall 11c and a fifth partition wall 11d that are integrally molded with a chassis 11, and a second partition wall 12b and a fourth partition wall 12d that are integrally molded with a base plate 12.

The fifth partition wall 11d is disposed between the second partition wall 12b and a filter circuit section 130. The fifth partition wall 11d has a structure similar to the structure of the first partition wall 11c. In other words, concave portions 16 and mounting portions 61a (refer to FIG. 4(b)) are formed on the upper surface of the fifth partition wall 11d. The base plate 12 is fastened to the mounting portions 61a of the fifth partition wall 11d with fastening members 152.

Other structures of the fifth embodiment are the same as those of the first embodiment, and members and portions corresponding to those of the first embodiment are given the same reference signs, and explanations about these members and portions will be omitted.

The electromagnetic noise propagation reduction structure 50D of the fifth embodiment has a structure obtained by replacing the third partition wall 12c of the fourth embodiment with the fifth partition wall 11d. In other words, while the third partition wall 12c is disposed nearer to the low voltage switching circuit section 120 than the first partition wall 11c is disposed in the fourth embodiment, the fifth partition wall 12d is disposed nearer to the filter circuit section 130 than the first partition wall 11c is disposed in the fifth embodiment. Furthermore, while the third partition wall 12c is molded with the base plate 12 in the fourth embodiment, the fifth partition wall 11d is molded with the chassis 11. Therefore, a possibility that electromagnetic noises absorbed by the electromagnetic noise propagation reduction structure 50D electromagnetically couple with other circuits is smaller than a possibility that electromagnetic noises absorbed by the electromagnetic noise propagation reduction structure 50C of the fourth embodiment do. For this reason, because it becomes possible to make electromagnetic noise propagation path longer, the fifth embodiment can provide an even larger electromagnetic noise reduction effect than the fourth embodiment.

Sixth Embodiment

FIG. 15 is a cross-section view showing a sixth embodiment of the electromagnetic noise propagation reduction structure of the present invention. FIG. 16 is a side view obtained when FIG. 15 is viewed from the x direction.

A DC-DC converter 100 according to the sixth embodiment includes an electromagnetic noise propagation reduction structure 50E.

The electromagnetic noise propagation reduction structure 50E is similar to the electromagnetic noise propagation reduction structure 50 of the first embodiment. However, the electromagnetic noise propagation reduction structure 50E is different from the electromagnetic noise propagation reduction structure 50 of the first embodiment in that concave portions 16 are not formed on the upper surface 61 of a first partition wall 11c.

As described in the first embodiment, the concave portions 16 of the first partition wall 11c are formed to prevent metal powder from being generated when the base plate 12 and the upper surface 61 of the partition wall 12b make contact with or scrape against each other and they are worn away at the time of receiving vibrations and impacts from the outside. However, if the DC-DC converter 100 is installed in an environment where the DC-DC converter 100 is rarely affected by the vibrations and impacts, it is not necessary that the concave portions 16 are formed on the upper surface 61 of the first partition wall 11c.

Other structures of the sixth embodiment are the same as those of the first embodiment, and members and portions corresponding to those of the first embodiment are given the same reference signs, and explanations about these members and portions will be omitted.

Even if the concave portions 16 are not formed on the upper surface 61 of the first partition wall 11c, and the upper surface 61 is flat, there are tiny interspaces in an area where the upper surface 61 and the base plate 12 get in surface contact with each other. Electromagnetic noises are propagated to filter housing section 31 through these interspaces. However, because an electromagnetic noise propagation path is formed longer by the first partition wall 11c and the second partition wall 12b, the electromagnetic noise propagation is suppressed.

In the above description, the structure where the concave portions 16 are not formed on the first partition wall 11c is applied to the electromagnetic noise propagation reduction structure 50 of the first embodiment as an example. However, the structure where the concave portions 16 are not formed on the first partition wall 11c can be also applied to the electromagnetic noise propagation reduction structure 50B to 50D of the second embodiment to the fifth embodiment respectively.

Seventh Embodiment

Figure 17:
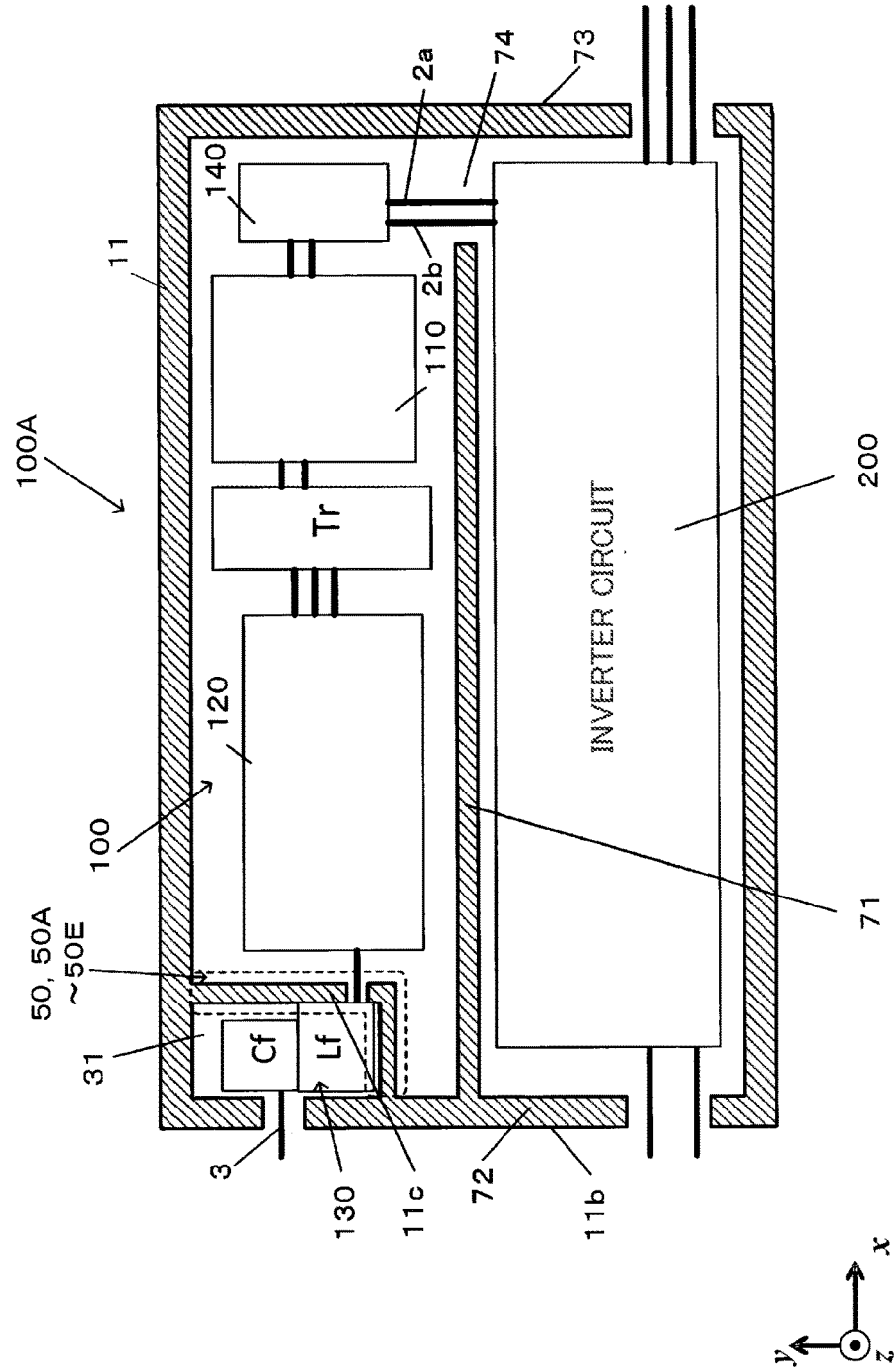
FIG. 17 is a cross-section view showing a seventh embodiment of the electric power converter device of the present invention.

FIG. 17 is a cross-section view showing a seventh embodiment of the electric power converter device of the present invention.

An electric power conversion device 100A shown in FIG. 17 includes a DC-DC converter circuit 100 and an inverter circuit 200 that are housed in a chassis 11. The inverter circuit 200 includes plural switching elements formed by, for example, IGBTs not shown, and the switching inverter circuit 200 is comprised of the plural switching elements and a capacitor module. The inverter executes power conversion on the DC high voltage output of a high voltage battery to obtain an AC high voltage for driving a motor.

A barrier wall 71, which is located at the middle of the y direction, that is, at the middle of the width direction, and extended to the x direction, that is, to the longitudinal direction, is integrally molded with the chassis 11. The barrier wall 71 is connected to one side wall 72 of a pair of side walls 72 and 73 extending to the y direction of the peripheral side wall 11b and is separated from the other side wall 73. An opening 74 is formed in a space portion between the barrier wall 71 and the other side wall 73. The inverter circuit 200 is connected to the DC-DC converter 100 via DC bus bars 2a and 2b that pass through the opening 74.

As is the case with the DC-DC converter 100 shown in FIG. 2, any one of the electromagnetic noise propagation reduction structures 50, 50A to 50E of the first to sixth embodiments is formed at one of the corner portions of the chassis 11. Therefore, as described in the first to sixth embodiments, electromagnetic noises emitted from the DC-DC converter 100 and the inverter circuit 200 are prevented from being propagated to an output-side filter circuit section 130 by any one of the electromagnetic noise propagation reduction structures 50, 50A to 50E.

(Electromagnetic Noise Reduction Effect)

The electromagnetic noise propagation reduction effects were verified by the electromagnetic noise propagation reduction structures 50, 50A to 50 according to the present invention using the following examples.

The power conversion device was assumed to be the power conversion device 100A including the DC-DC converter 100 and the inverter circuit 200 in the metal chassis 11 as shown in FIG. 17.

In the first example, the electromagnetic noise propagation reduction structure 50 was formed in the chassis 11 as shown in FIG. 5.

In the second example, the electromagnetic noise propagation reduction structure 50A was formed in the chassis 11 as shown in FIG. 7.

In the third example, the electromagnetic noise propagation reduction structure 50B was formed in the chassis 11 as shown in FIG. 9.

In the fourth example, the electromagnetic noise propagation reduction structure 50C was formed in the chassis 11 as shown in FIG. 11.

As a comparison example, an electromagnetic noise propagation reduction structure (refer to a diagram of a comparison example shown in FIG. 18), in which a partition wall, which is disposed nearer to a low voltage switching circuit section 120 than a first partition wall 11c is disposed, is integrally molded with a base plate 12, has been formed.

A measurement standard structure is assumed to be a structure including only a first partition wall in a chassis 11 (refer to the measurement standard structure shown in FIG. 18).

The measurement results of the electromagnetic noise reduction rates of the first to fourth examples and the comparison example relative to the measurement result of the electromagnetic noise amount of the measurement standard structure are shown in FIG. 18.

As shown in FIG. 18, the electromagnetic noise reduction amount of the comparison example relative to the electromagnetic noise amount of the measurement standard structure was only 0.7 dB.

Compared to this, the reduction amounts of electromagnetic noises of the first to fourth examples were 1.8 dB, 2.0 dB, 3.5 dB, and 6.2 dB respectively.

As shown above, it was verified that each embodiment of the present invention brought about a larger amount of electromagnetic noise reduction than the comparison example.

In the structures of the above embodiments, it has been exemplarily described that the first partition wall 11c is integrally molded with the chassis 11. However, it is conceivable that, after the first partition wall 11c is formed as a member independent of the chassis 11, the first partition wall 11c and the chassis 11 are brought together by means of welding or the like. Alternatively, it is conceivable that a groove is formed in one of the chassis 11 and the first partition wall 11c, a protrusion is formed in the other, and the chassis 11 and the first partition wall 11c are unified by shrinkage fitting or freeze fitting, or the chassis 11 and the first partition wall 11c are fastened using a fastening member with the groove and the protrusion engaged.

The same can be said for the relation between the base plate 12 and the second to fourth partition wall 12b, 12c, and 12d. In other words, the base plate 12 and each partition wall can be unified by fitting the groove and the protrusion, or the plate 12 and each partition wall can be fastened using a fastening member with the groove and the protrusion engaged.

In each of the structures of the above embodiments, it was exemplarily described that the filter housing section 31 was formed at one of the corner portions of the chassis 11, and the filter housing section 31 was separated from the filter circuit section 130 with the L-shaped first partition wall 11c. Alternatively, as shown in FIG. 19(a), it is possible to make the structure of the filter housing section 31 by forming the peripheral side wall 11b so that the peripheral side wall 11b becomes U-shaped in a plan view, and by forming the first partition wall 11c so that the first partition wall 11c blocks off the opening of the U-shaped peripheral side wall 11b. In the case of this structure, the shape of the first partition wall 11c becomes linear, so that the electromagnetic noise propagation reduction structure can be formed in a linear shape along the first partition wall 11c.

In contrast, as shown in FIG. 19(b), it is also possible to make the structure by forming the first partition wall 11c so that the first partition wall 11c becomes U-shaped in a plan view, and by forming the side wall of the chassis 11 so that side wall blocks off the opening of the U-shaped first partition wall 11c. In the case of this structure, it is desirable that the electromagnetic noise propagation reduction structure should be formed in a U shape along the first partition wall 11c.

In addition, as shown in FIG. 19(c), it is also possible that the first partition wall 11c is formed so that the first partition wall 11c becomes frame-shaped inside the peripheral side wall 11b of the chassis 11. In this structure, it is desirable that the electromagnetic noise propagation reduction structure should be formed in a frame shape along the first partition wall 11c.

It was exemplarily described that the ground pattern of the control circuit section formed on the control circuit board 151 was fixed to the base plate 12 with the fastening members 152, and the ground pattern and the base plate 12 had the same potential. However it is conceivable that the ground pattern of the control circuit section is connected to the base plate 12 via a capacitor.

In the above-described embodiment, the DC-DC converter 100 and the inverter 200 were exemplified as active circuits that emitted noises. However, the present invention can be applied not only to the above type of power conversion device but also to many other types of power conversion devices.

In the above explanations, only some embodiments have been described, and the present invention cannot be limited to the above embodiments.

In brief, a power conversion device needs only to be one that includes an active circuit section that emits noises and an output-side filter circuit section in a chassis made of conductive material such as metal, and further includes a first partition wall that is formed with the chassis and disposed between the active circuit section and the filter circuit section and a second partition wall that is formed with a base plate and disposed between the first partition wall and the filter circuit section. It is sufficient that the chassis and the base plate are formed of conductive material and it is not always necessary that they are made of metal.

The disclosure of the next application, on which the right of priority of the present invention is based, is incorporated herein by reference in its entirety.

Japanese Patent Application No. 2015-35485 (filed on Feb. 25, 2015)

LIST OF REFERENCE SIGNS

11: Chassis
11b: Peripheral Side Wall
11c: First Partition Wall
11d: Fifth Partition Wall
12: Base Plate
12b: Second Partition Wall
11c: Third Partition Wall
12d: Fourth Partition Wall
14: Case Lid
16: Concave Portion
17: Interspace
31: Filter Housing Section
32: Conversion Circuit Section Housing Section
50, 50A to 50E: Electromagnetic Noise Propagation Reduction Structure
61: Upper Surface
61a: Mounting Portion (Fastening Protrusion)
71: Barrier Wall
72: Partition Wall 100: Electric Power Conversion Device (DC-DC Converter)
100A: Electric Power Conversion Device
110: High Voltage Switching Circuit Section
120: Low Voltage Switching Circuit Section
130, 140: Filter Circuit Section
151: Control Circuit Board
200: Inverter Circuit (Active Circuit Section)

The invention claimed is:

1. An electric power conversion device comprising:
an active circuit section emitting noises;
an output-side filter circuit section;
a chassis including a first space and a second space for housing the active circuit section and the filter circuit section respectively; and
a base plate that is installed so as to cover at least the first space and is electrically connected to the chassis,
wherein the chassis includes a first partition wall for partitioning the first space and the second space,
the base plate is disposed so as to cover the first space, and includes a second partition wall along the first partition wall, and
the second partition wall is disposed between the filter circuit section and the first partition wall in the first space, and
wherein the chassis includes a fifth partition wall that is disposed nearer to the filter circuit section than the second partition wall is disposed, and along the first partition wall.

2. The electric power conversion device according to claim 1,
wherein the first partition wall is integrally molded with the chassis, and
the second partition wall is integrally molded with the base plate.

3. The electric power conversion device according to claim 2,
wherein the base plate is fastened to the upper surface of the first partition wall with a fastening member.

4. The electric power conversion device according to claim 3,
wherein a fastening protrusion, to which the base plate is fastened in surface contact, is formed on the upper surface of the first partition wall.

5. The electric power conversion device according to claim 1,
wherein the base plate includes a third partition wall that is disposed along the first partition wall, and nearer to the active circuit section than the first partition wall.

6. The electric power conversion device according to claim 1,
wherein the chassis includes a side wall that is disposed along the circumference of the filter circuit section, and
the base plate includes a fourth partition wall formed along the inner surface of the side wall in the first space.

7. The electric power conversion device according to claim 6,
wherein the fourth partition wall is integrally molded with the base plate.

8. An electric power conversion device comprising:
a DC-DC converter circuit;
an output-side filter circuit section connected to the DC-DC converter circuit;
an inverter circuit;
a metal chassis for housing the DC-DC converter circuit, the filter circuit section, and the inverter circuit; and
a metal base plate electrically connected to the metal chassis,
wherein the chassis includes a first chassis-side partition wall for shielding the filter circuit section from the DC-DC converter and the inverter circuit, and a side wall disposed along the circumference of the filter circuit section,
the chassis is further partitioned by the first chassis-side partition wall and the side wall of the chassis, and includes a first space for housing the filter circuit section, and
the base plate is disposed so as to cover the first space, formed along the inner surface of the side wall, and includes a first base plate-side partition wall extended to the filter circuit section side,
wherein the base plate further includes a second base plate-side partition wall disposed between the first chassis-side partition wall and the DC-DC converter circuit, and
wherein the chassis further includes a second chassis-side partition wall disposed between the first chassis-side partition wall and the filter circuit section.

* * * * *